US009444439B2

(12) United States Patent
Hamond

(10) Patent No.: US 9,444,439 B2
(45) Date of Patent: Sep. 13, 2016

(54) PULSE GENERATING CIRCUIT FOR AUDIO-FREQUENCY AMPLIFIERS AND REGULATED POWER SUPPLIES

(71) Applicant: INDICE SEMICONDUCTOR INC., Tualatin, OR (US)

(72) Inventor: James Hamond, Victoria (AU)

(73) Assignee: Indice Semiconductor Inc., Tualatin, OR (US)

( * ) Notice: Subject to any disclaimer, the term of this patent is extended or adjusted under 35 U.S.C. 154(b) by 0 days.

(21) Appl. No.: 14/397,819

(22) PCT Filed: Apr. 30, 2013

(86) PCT No.: PCT/AU2013/000452
§ 371 (c)(1),
(2) Date: Oct. 29, 2014

(87) PCT Pub. No.: WO2013/163691
PCT Pub. Date: Nov. 7, 2013

(65) Prior Publication Data
US 2015/0145582 A1 May 28, 2015

(30) Foreign Application Priority Data

Apr. 30, 2012 (AU) ................................ 2012901689

(51) Int. Cl.
H03K 5/01 (2006.01)
H03K 7/08 (2006.01)
H03K 9/08 (2006.01)
H03F 3/217 (2006.01)
H02M 1/08 (2006.01)
H03K 5/02 (2006.01)

(52) U.S. Cl.
CPC ................ *H03K 5/01* (2013.01); *H02M 1/08* (2013.01); *H03F 3/2173* (2013.01); *H03K 5/02* (2013.01); *H03K 7/08* (2013.01); *H03K 9/08* (2013.01)

(58) Field of Classification Search
CPC ...... H02M 1/08; H02M 1/088; H02M 3/135; H02M 3/158; H02M 3/07; H03K 5/02; H03K 7/08; H03K 9/08; H03K 17/063; H03F 3/195; H03F 3/2173; H03F 3/245; H03F 2200/451
USPC ........ 327/159, 291, 536, 108, 109, 110, 111, 327/112
See application file for complete search history.

(56) References Cited

U.S. PATENT DOCUMENTS 6,614,297 B2* 9/2003 Score ...................... H03F 3/217
330/10
7,932,778 B1 4/2011 Cyrusian
2003/0214274 A1 11/2003 Lethellier
2007/0290627 A1* 12/2007 Xiequn ................ H05B 41/295
315/291
2011/0095836 A1 4/2011 Putzeys

FOREIGN PATENT DOCUMENTS

GB 2473625 A 3/2011
WO 9741558 11/1997
WO 00/22727 4/2000

OTHER PUBLICATIONS

Straayer, et al., "A 12-Bit, 10-MHz Bandwidth, Continuous-Time ΣΔ ADC With a 5-Bit, 950-MS/s VCO-Based Quantizer", in IEEE Journal of Solid-State Circuits vol. 43, No. 4 http://ieeexplore.ieee.org/stamp/stamp.jsp?tp=&arnumber=4476512 &isnumber=4476475, Apr. 2008, pp. 805-814.

* cited by examiner

*Primary Examiner* — John Poos
(74) *Attorney, Agent, or Firm* — Stoel Rives LLP

(57) ABSTRACT

A circuit for generating a series of pulses in response to a first signal, the circuit comprising: a lossy integrator which receives a second signal as its input; and a comparator which: receives the output of the lossy integrator at one of its inputs; and receives the first signal at the other of its inputs. This circuit can be incorporated into, for example, audio-frequency amplifiers and regulated power supplies.

23 Claims, 20 Drawing Sheets

PULSE GENERATING CIRCUIT FOR AUDIO-FREQUENCY AMPLIFIERS AND REGULATED POWER SUPPLIES

FIELD OF THE INVENTION

The present invention relates to electronic circuits. In particular, it relates to electronic circuits which can be incorporated into, for example, audio-frequency amplifiers and regulated power supplies.

BACKGROUND TO THE INVENTION

Design criteria for an ideal audio-frequency amplifier include maximization of energy efficiency (and thus minimization of heat production), minimization of weight and minimization of bulk.

One type of highly efficient audio-frequency amplifier is known as a "class-D" amplifier. In a class-D amplifier, an input signal controls a pulse generator to produce a sequence of pulses of differing widths. These pulses are averaged over time (such as by using a low-pass filter) to produce an output signal. Because the pulses are of fixed amplitude, the switching elements (which are usually MOSFETs) are switched either completely on or completely off. A MOSFET operates with the lowest resistance when it is fully on and thus has the lowest power dissipation when in that condition, except when fully off where no power is consumed or drawn.

The invention described in U.S. Pat. No. 8,289,097 assigned to Hypex Electronics B.V. (the "Hypex patent") discloses a pulse width modulation loop of a simple construction which disturbs the input signal to be processed as little as possible. The circuit can be incorporated into audio-frequency amplifiers such as a class-D amplifier.

Specifically, and referring to FIG. 6 of the Hypex patent, the Hypex patent is concerned with a post filter fixed frequency converter with an external sawtooth waveform. This sawtooth waveform is corrected by factors that represent the behaviour of the various parts of the circuit which include the filter, the feedback network, "the forward path" and the comparator. The invention disclosed in the Hypex patent is limited to "fixedly" determined or known clock circuits as described in paragraph [0023] of that document.

The Hypex patent also relies on predetermining the response of the amplifier by extensive internal measurement circuits so that the various factors can be determined. Of course these factors are very complex and are products of temperature, load, and frequency. To accurately determine these factors over these ranges requires significant computational effort.

Further, 'Improved analogue class-D amplifier with carrier symmetry modulation' B. H. Candy and S. M. Cox, *Audio Engineering Society* 117th *Convention*, 28-31 Oct. 2004 San Francisco, Calif., USA Convention Paper 6260, looks at reducing distortion in a class-D amplifier application. The analogue class-D amplifier disclosed follows the well known prior-art class-D structure with negative feedback, but includes modulation of the symmetry of the carrier oscillator waveform by a derivative of the input signal. The disclosed circuit compensates a nonlinear phase modulation effect that is intrinsic to the prior art structure.

Embodiments of the present invention provide circuits for generating pulse waveforms which are particularly suitable for, but not limited to, controlling the known class-D circuit.

Furthermore, embodiments of the present invention aim to ameliorate some of the disadvantages of the prior art.

SUMMARY OF THE INVENTION

Accordingly, in one aspect, the present invention provides a circuit for generating a series of pulses in response to a first signal, the circuit comprising: a lossy integrator which receives a second signal as its input; and a comparator which: receives the output of the lossy integrator at one of its inputs; and receives the first signal at the other of its inputs.

A lossy integrator refers to an integrator with a decay component. One embodiment of such a device is an RC network with a long time constant relative to the chosen switch frequencies. In mathematical terms, this may be an integrator, with or without error, with a decay term that may be either linear or non linear.

It is preferred that the lossy integrator comprises a resistor and a capacitor in series. Alternatively it is preferred that the lossy integrator comprises: a resistor and a capacitor in series; and a resistor in parallel with the capacitor, the input to the lossy integrator being applied across both resistors and the output from the lossy integrator being generated across the capacitor.

In an embodiment, the comparator receives the output of the lossy integrator at its summing input and receives the first signal at its negating input.

It is preferred that at least one of: the lossy integrator; and the comparator is implemented by using digital operations.

It is preferred that a signal which is determined by the output of the comparator controls the switching of at least one switching element.

It is preferred that the switching elements are in a half-bridge configuration. Alternatively, the switching elements are in a full-bridge configuration.

It is preferred that the switching elements switch power to a load.

It is preferred that a low-pass filter is interposed between the switching elements and the load. Alternatively, the load also operates as a low-pass filter.

It is preferred that the second signal depends at least partly on the output of at least one switching element.

It is preferred that the first signal depends at least in part on a bias signal.

It is preferred that first signal depends at least in part on a signal which is to be amplified.

It is preferred that each switching element is a transistor, for example, a FET.

BRIEF DESCRIPTION OF THE DRAWINGS

For a better understanding of the invention, and to show how it may be carried into effect, embodiments of it are shown, by way of non-limiting example only, in the accompanying drawings. In the drawings.

DESCRIPTION OF PREFERRED EMBODIMENT

Figure 1:
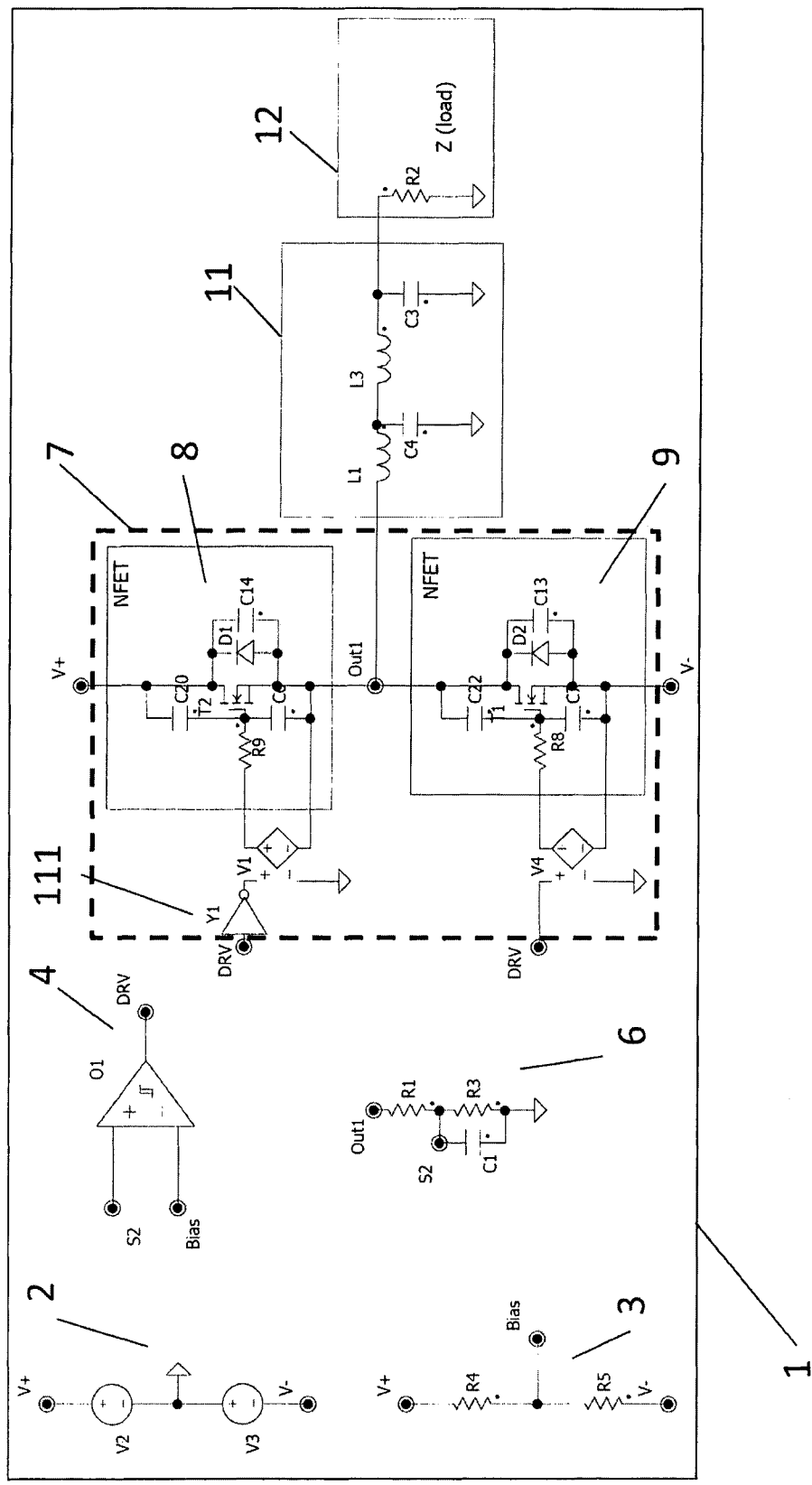
FIG. 1 is a schematic of a circuit according to a first embodiment of the present invention.

Structure of the Embodiment of FIG. 1

The circuit 1 of FIG. 1 illustrates an embodiment of the invention which operates as a regulated power supply. The circuit 1 comprises a power supply unit 2, a bias generator 3, a comparator 4, a lossy integrator 6, a half-bridge switching circuit 7, a low-pass filter network 11 and a load 12.

The power supply unit 2 comprises two identical voltage sources $V_2$, $V_3$ which are grounded at the mid-point.

The bias generator 3 comprises two resistors R4 and R5 which are connected in series across the power supply rails V+ or V−, generating a bias voltage $V_{Bias}$ at their junction. $V_{Bias}$ is determined by the voltages on each power supply rail and by the ratio R5/(R4+R5).

The lossy integrator 6 generates the signal S2. The lossy integrator 6 comprises resistors R1 and R3 connected end-to-end between the output Out1 and ground, with capacitor C1 between the junction of resistors R1 and R3 and ground. The signal S2 is tapped off the junction of resistors R1 and R2. The lossy integrator is thus a voltage divided, low pass filter. The break frequency of that filter is determined by the parallel equivalent resistance of R1 and R3 and by the capacitance of capacitor C1. Ideally this RC value should be set above the maximum required signal frequency. Subtle but important is the fact that the signal distortion at the output Out1, both the switched and steady state, is present in the integrator signal S2.

The half-bridge switching circuit 7 comprises a first NFET circuit 8 and a second NFET circuit 9 which are connected in series between the positive and negative power supply rails V+ or V−, to generate the output Out1 at their junction. The NFET circuit 8 receives the signal DRV at its input through an inverter Y1 111 and the NFET circuit 9 receives the signal DRV at its input. The signal Out1 represents the half bridge output voltage, and ideally is either V+ or V− depending on which FET is on. In practical applications, this is not achievable in either steady state (not switching) or switching mode due to non-ideal behaviour of the FETs. This non-ideal behaviour results in distortion of the signal Out1 which in turn causes potential distortion at the load 12 if not compensated. This is a common major issue with traditional circuits.

The comparator 4 receives $V_{Bias}$ at its inverting input and the signal S2 from the lossy integrator at its non-inverting input to generate a signal DRV. The comparator then compares the bias signal $V_{Bias}$ with S2, and switches high or low depending on whichever is higher. The signal DRV switches one of the NFET circuits 8 and 9 on and the other of them off, depending on the polarity of the DRV signal. Theoretically the switching speed would be infinite, but delays are present throughout the system. These delays include the comparator hysteresis, the bridge switching delay and delays in the FET driver signals, and phase shift delays of the lossy integrator.

Operation of the Embodiment of FIG. 1

Figure 2:
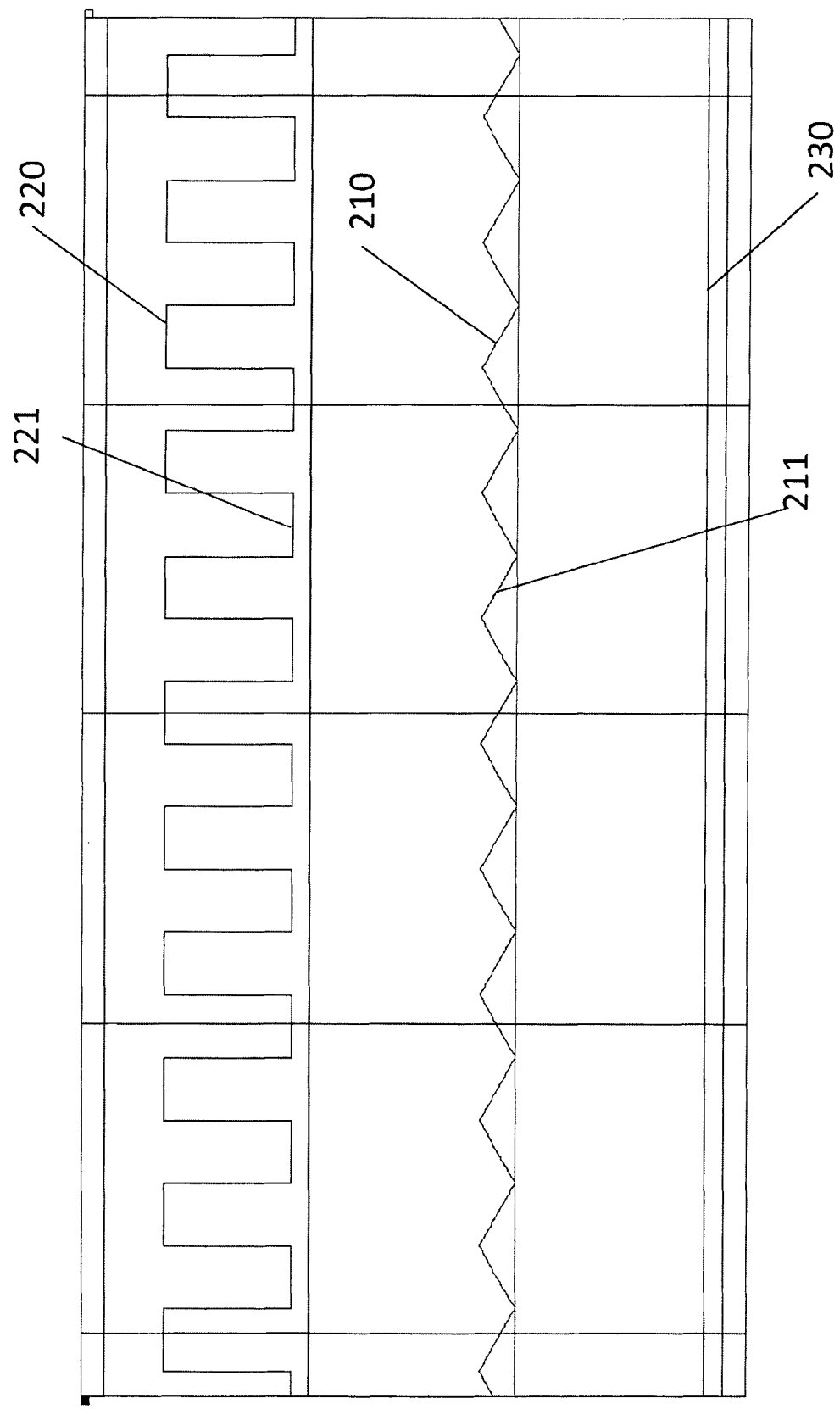
FIG. 2 is a set of graphs illustrating voltage waveforms at a number of points in FIG. 1.

The operation of circuit 1 is illustrated by the signal traces shown in FIG. 2. To simplify understanding of the circuit of FIG. 1, each NFET circuit 8 and 9 can be considered to be a binary state machine with infinitely quick transition times. Referring to FIG. 2, when the signal DRV 220 transitions from high to low, the top NFET 8 turns on, and simultaneously the bottom NFET 9 turns off. This means that Out1 is now equal to V+, having been equal to V− before DRV changed. The step response change in the input to the lossy integrator 6 causes a ramping voltage at S2, in this case up from where ever it was prior to the transition. This can be seen in FIG. 2, where the waveform S2 210 is a triangle, or ramping function, as a result of the waveform DRV 220 transitioning.

When the ramp exceeds the Bias 230, DRV will change state again, which causes Out1 to go from V+ back to V−, which in turn causes S2 to ramp down 211 again. When S2 falls back below the Bias 230, DRV will transition again 221.

The edge transition gradient at Out1 is of course not infinite, in fact, it is not even linear. Power rail fluctuations mean that there is always variation at Out1. The lossy integrator 6 detects these fluctuations, which are presented to the comparator 4 along with the desired signal. The errors are compensated for by being compared to the original signal.

Assuming that the voltage rails, driver FETs and load are all stable then this example will resonate at the system's maximum speed with a fixed duty cycle. This will result in zero signal at the output at a low signal frequency, and a small signal at the switching frequency due to the filter. However if noise is injected into either FET or into the power supply rails, or if there are other noise sources, then the comparator 4 will automatically compensate to force the signal S2 to be neutral relative to the bias voltage. This results in a very small or zero difference across the load, and therefore very little or no noise.

The circuit 1 of FIG. 1 therefore operates as a highly stable regulated power supply.

In the following description, where the components shown in any of the figures are the same as the components shown in the circuit of FIG. 1, the same reference numbers are used to identify those components.

Simplified Illustrative Structure

Figure 3:
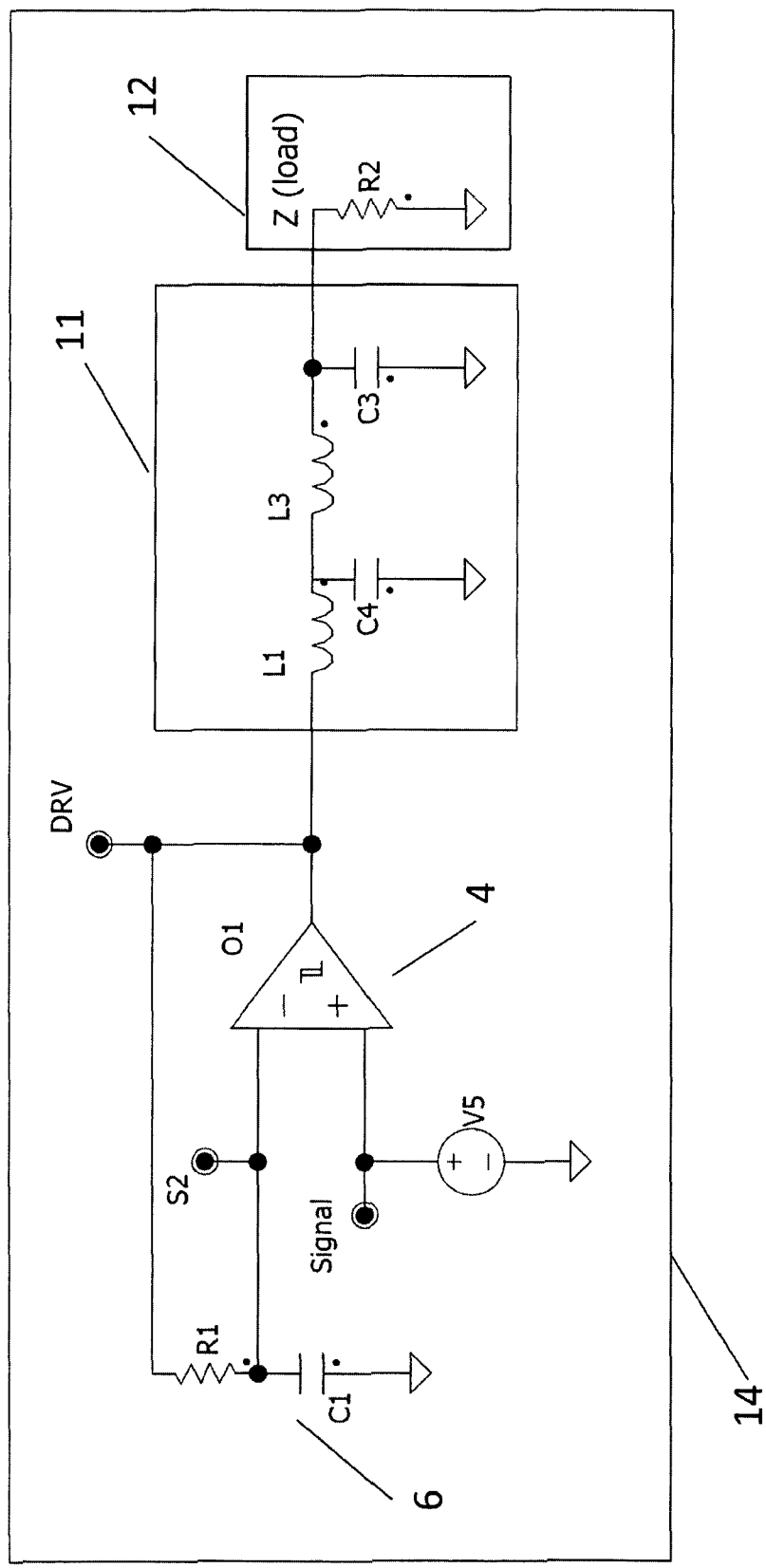
FIG. 3 is a simplified schematic of FIG. 1 and a second embodiment of the present invention.
Figure 3A:
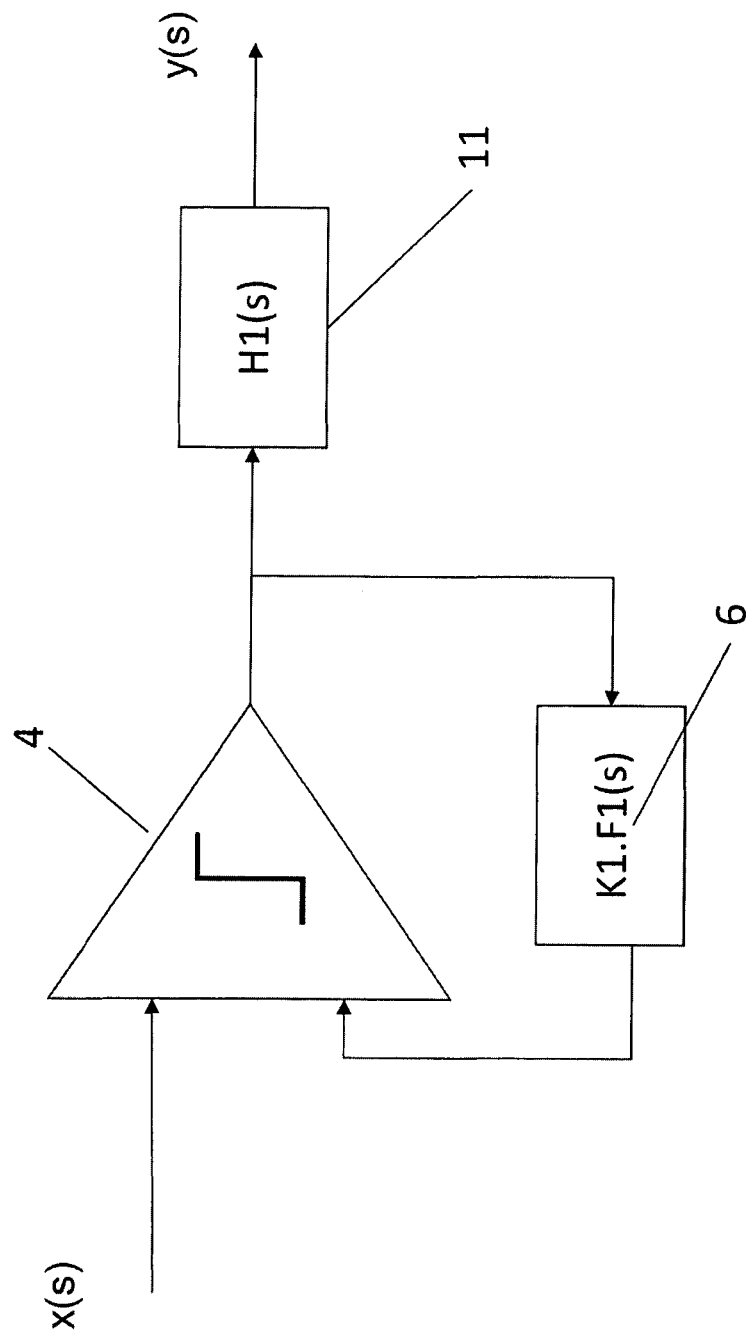
FIG. 3A is a mathematical model of the embodiment shown in FIG. 3.

The circuit illustrated in FIG. 1 is shown in a simplified form (excluding the half-bridge switching circuit) in the schematic shown in FIG. 3. This schematic will be used to illustrate aspects of the operation of the invention. FIG. 3A is a mathematical model corresponding to the simplified circuit of FIG. 3. This simplified circuit forms a second embodiment of the invention and could be used for various applications including an encoder, a low power amplifier, a low power supply unit or an isolating encoder.

Figure 4:
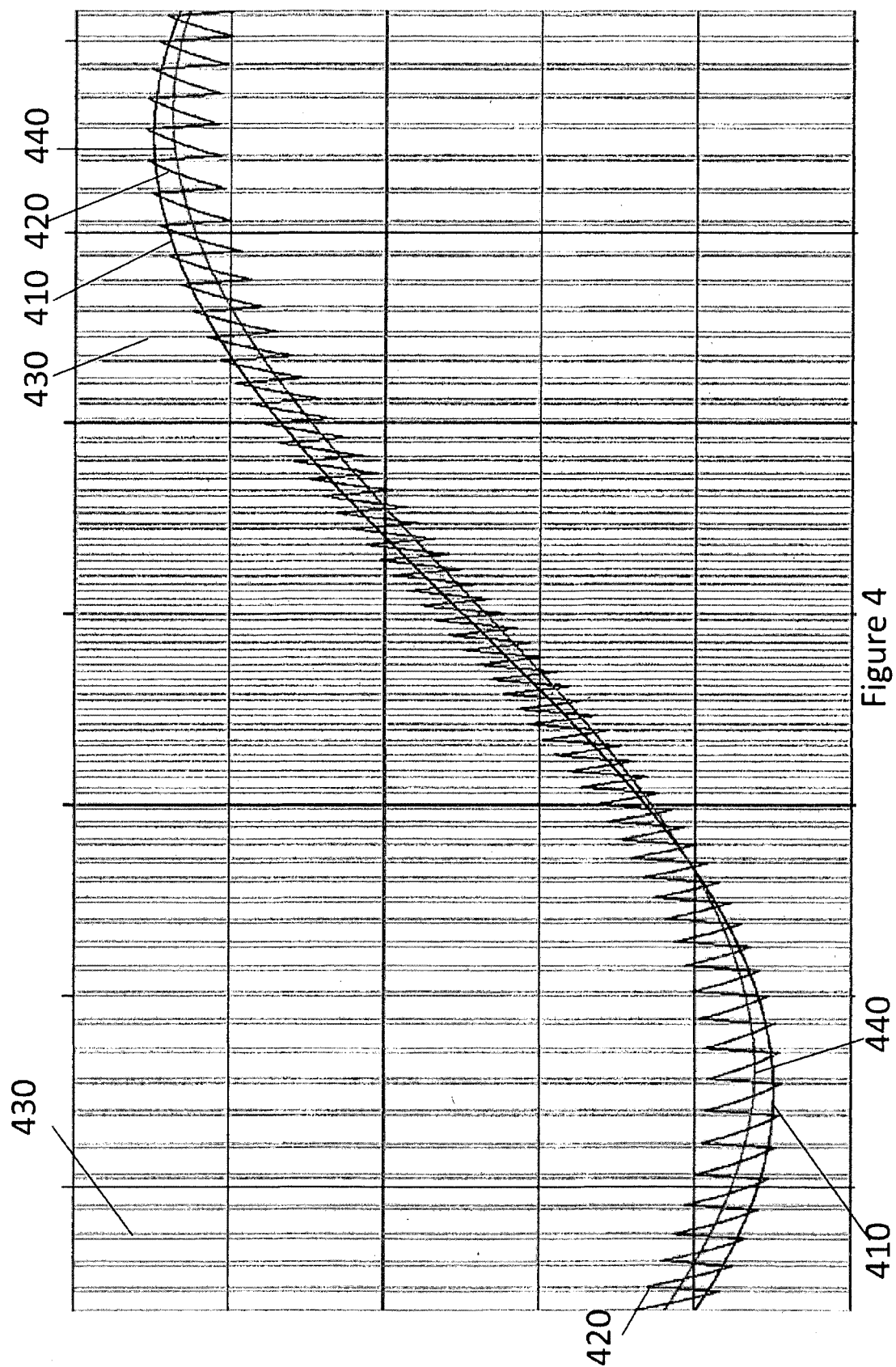
FIG. 4 illustrates the voltage waveforms at a number of points in FIG. 3.
Figure 4A:
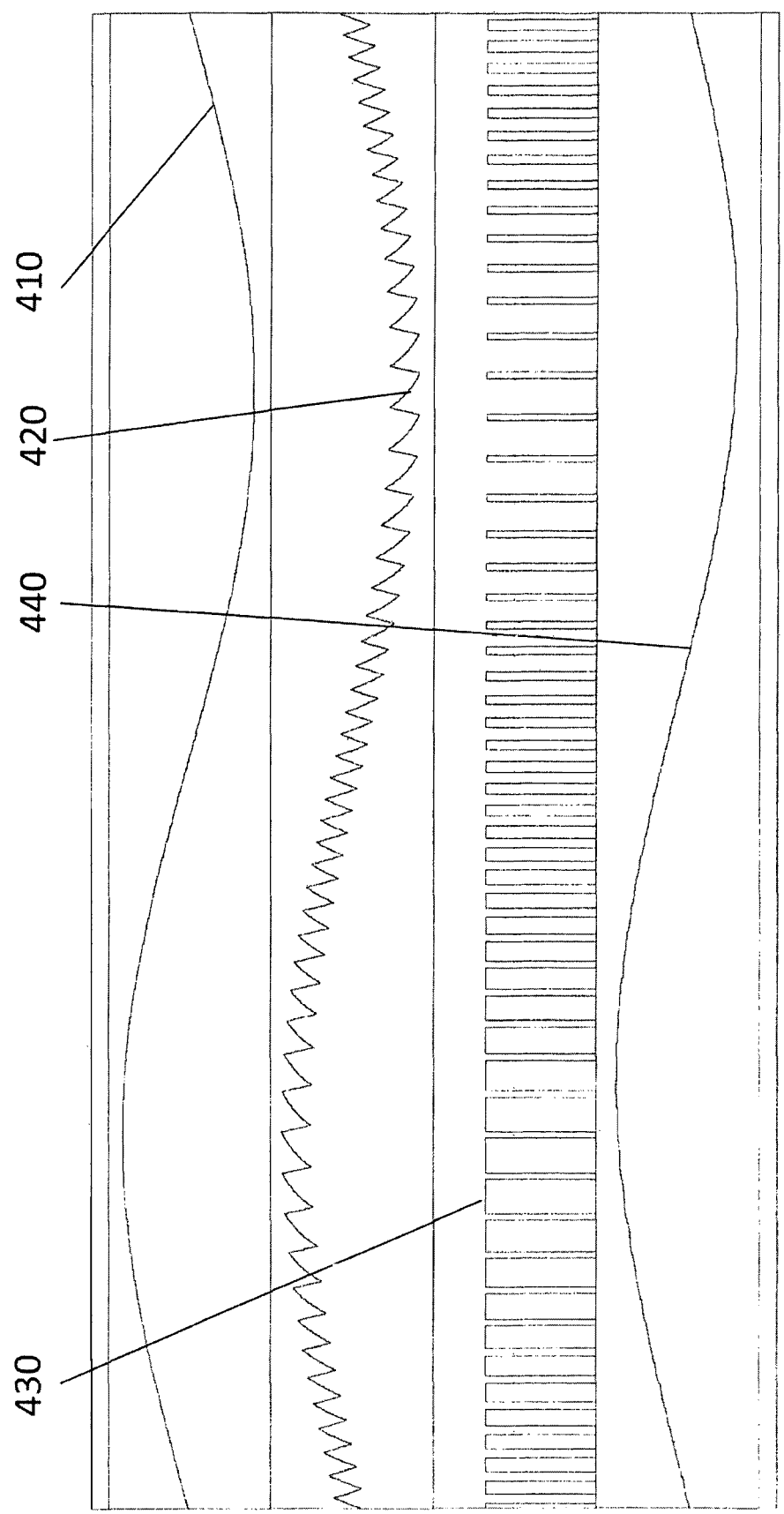
FIG. 4A is an alternative representation of the waveforms shown in FIG. 4.
Figure 5:
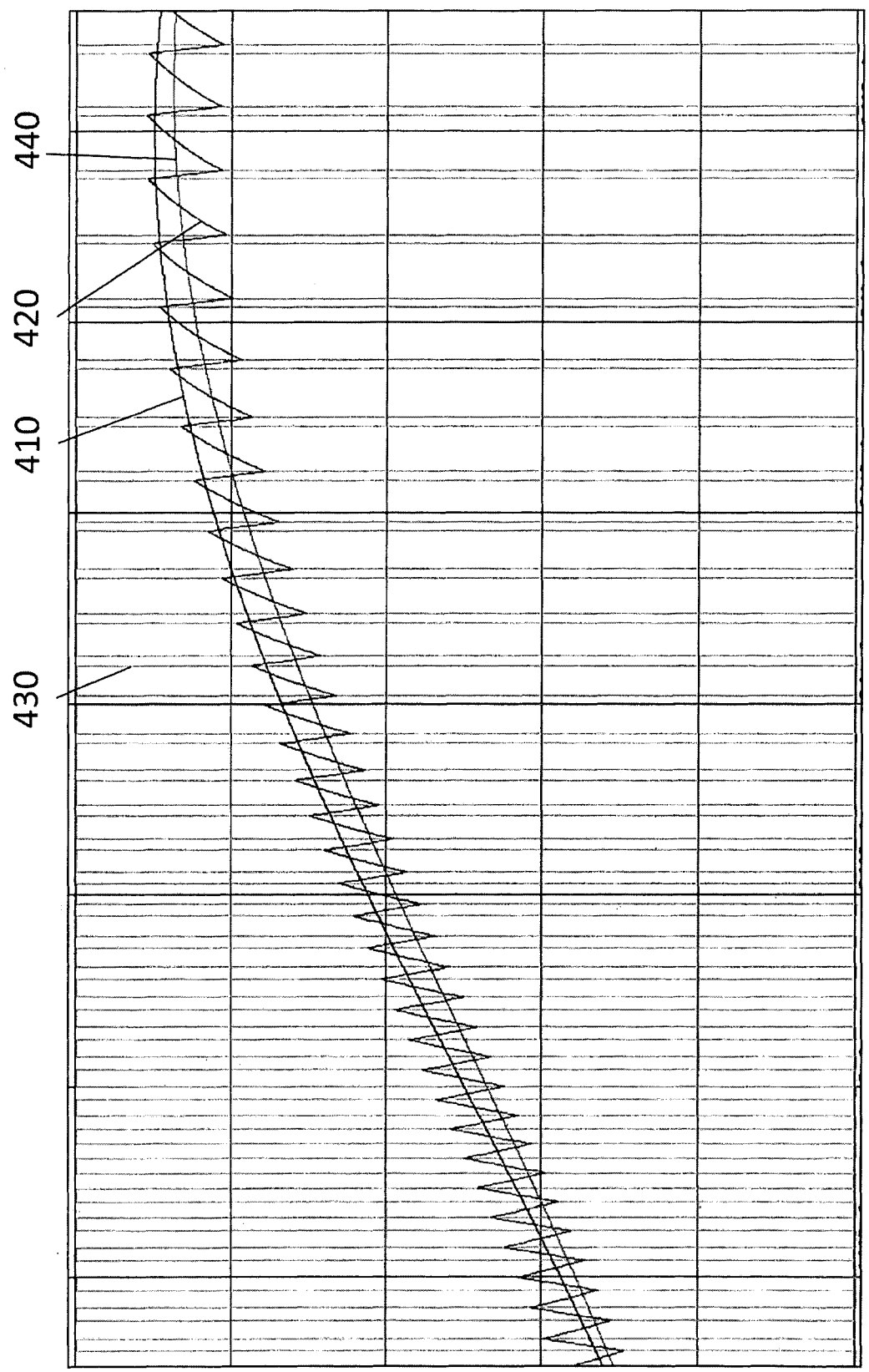
FIG. 5 is a zoomed in view of the voltage waveforms shown in FIG. 4.

FIGS. 4, 4A and 5 each illustrate the voltage waveforms at a number of points in FIG. 3. The waveforms are placed on the same axis in FIGS. 4 and 5 to show their relative relationship. In FIG. 4A the waveforms are placed on separate axis to more clearly show the individual shapes of the waveforms.

The circuit 14 includes a lossy integrator 6, a comparator 4, a filter network 11 and a load 12. The mathematical model shown in FIG. 3A depicts a signal X(s) as an input to a comparator 4, the other input being a feedback signal from the output of the comparator 4 transformed by the function K1·F1(s) where K1 is a constant and F1(s) represents the lossy integrator 6. The function H1(s) represents the filter network 11 in FIG. 3.

The circuit 14 receives a signal from a signal source V5 which is represented by the curve $V_{signal}$ 410 in FIGS. 4, 4A and 5. The lossy integrator 6 produces a triangle signal which is illustrated by the graph $V_{S2}$ 420 in FIGS. 4, 4A and 5. The comparator produces a pulse output which is represented by the graph $V_{DRV}$ 430 in FIGS. 4, 4A and 5. The filter 11 produces an output $V_{R2}$ 440 which is applied to the load 12. The circuit 14 may include a gain component by adding a resistor across C1. In addition, V5 could be derived from the system voltage, thereby rejecting power rail ripple.

As can be seen from FIGS. 4, 4A and 5, so long as $V_{S2}$ 420 (the triangle output of the lossy integrator) is above the signal value $V_{signal}$ 410, the drive voltage $V_{DRV}$ 430 is low, and the output of the integrator $V_{S2}$ 420 decreases in value. If the output of the lossy integrator $V_{S2}$ 420 is below the signal $V_{signal}$ 410, then the drive voltage $V_{DRV}$ 430 is high, raising the output $V_{S2}$ 420 of the lossy integrator. This results in self oscillation because the triangle wave form $V_{32}$ 420 of the lossy integrator will always be moving about the signal $V_{signal}$ 410 so long as $V_{signal}$ 410 stays within the $V_{DRV}$ output boundaries defined by the high and low values.

The advantage of this embodiment is that hardware or software implementation of the circuit is simple compared to that of the prior art, such as the Hypex patent referred to earlier. In addition, the distortion exhibited by the circuit is reduced compared to that of the prior art.

Other Embodiments of the Invention

Figure 6:
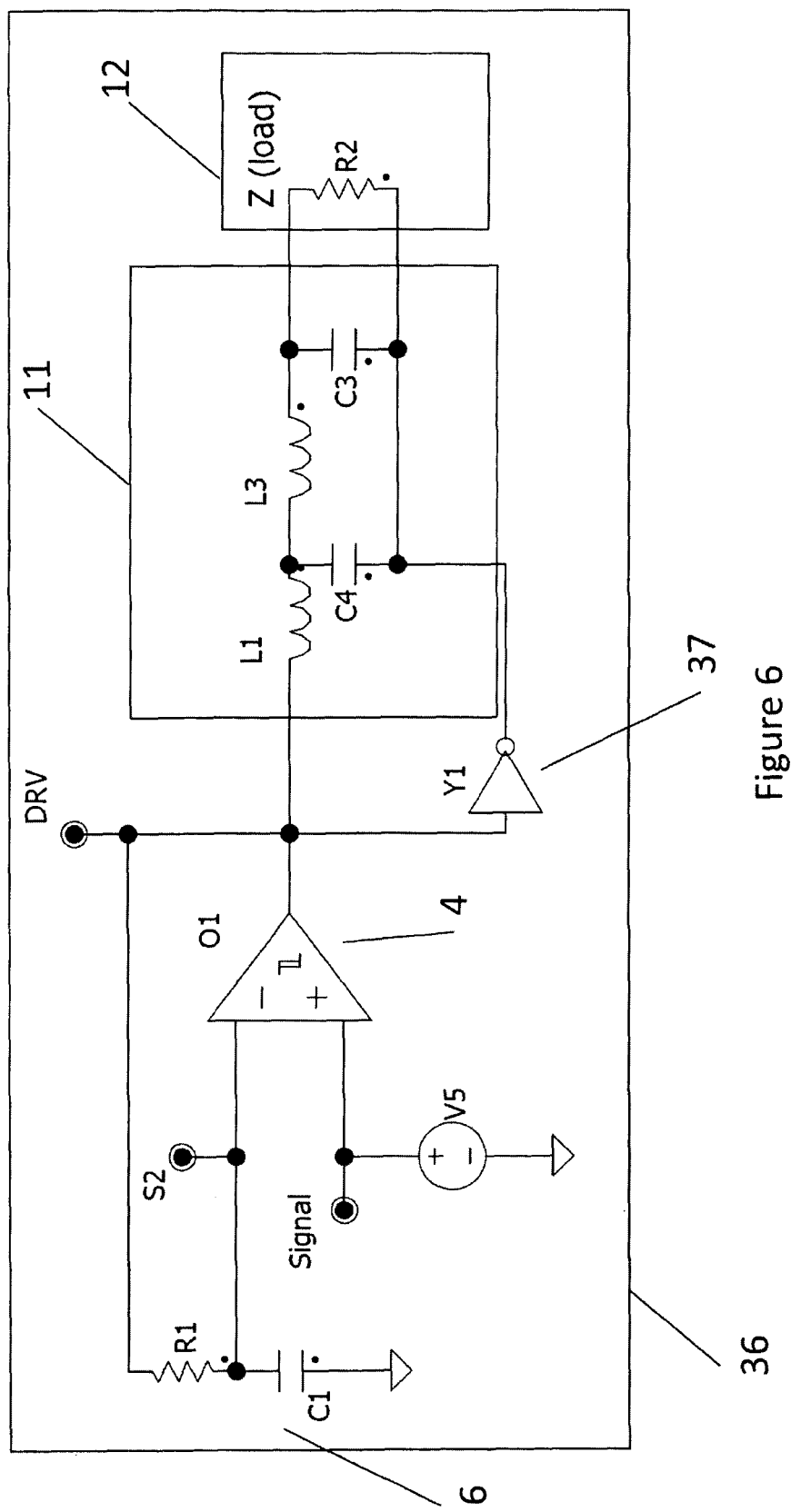
FIG. 6 is a schematic of a circuit according to a third embodiment of the present invention.

The circuit 36 of FIG. 6 is a simplified representation of third embodiment of the invention. The circuit 36 is a slightly more complex circuit than circuit 14 in FIG. 3, in that it includes one additional component. The components shown in FIG. 6 are a lossy integrator 6, a comparator 4, an inverter 37, a low-pass filter network 11 and a load 12. The output of the comparator 4 is an input to one side of the filter network 11 and the negated output of the comparator 4 is input to the other side of the filter network 11. This arrangement is advantageous over the circuit of FIG. 3 because it results in a higher gain, a gain of 2, because there is an input to the filter network 11 in phase with, and in anti-phase with, the pulse output of the comparator 4. Furthermore it has four times the power of the circuit of FIG. 3. In addition, there is no DC offset; this is preferable when using inductive loads such as speakers. As with circuit 14, further gain could be created by adding a resistor across C1.

Figure 7:
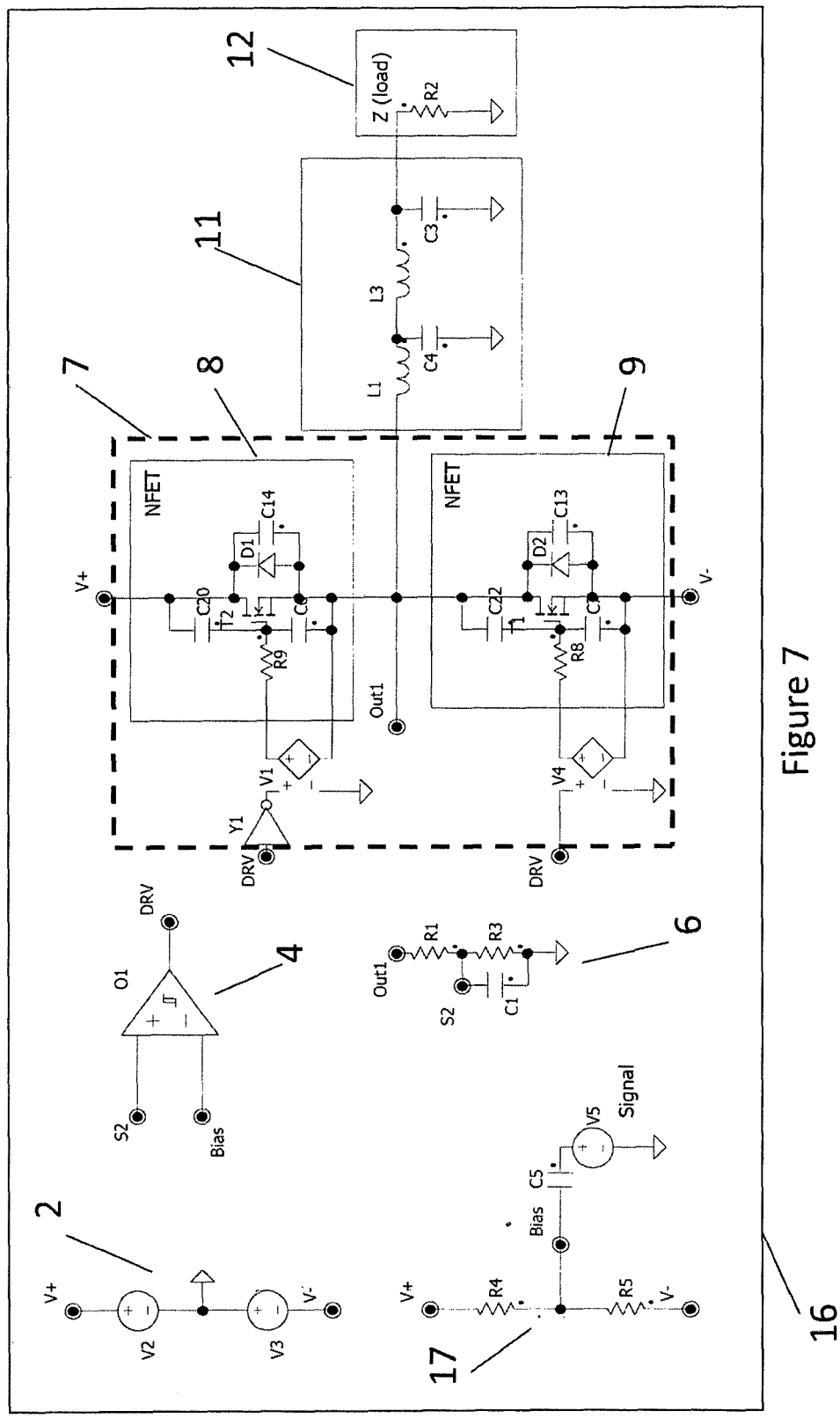
FIG. 7 is a schematic of a circuit according to a fourth embodiment of the present invention.
Figure 8:
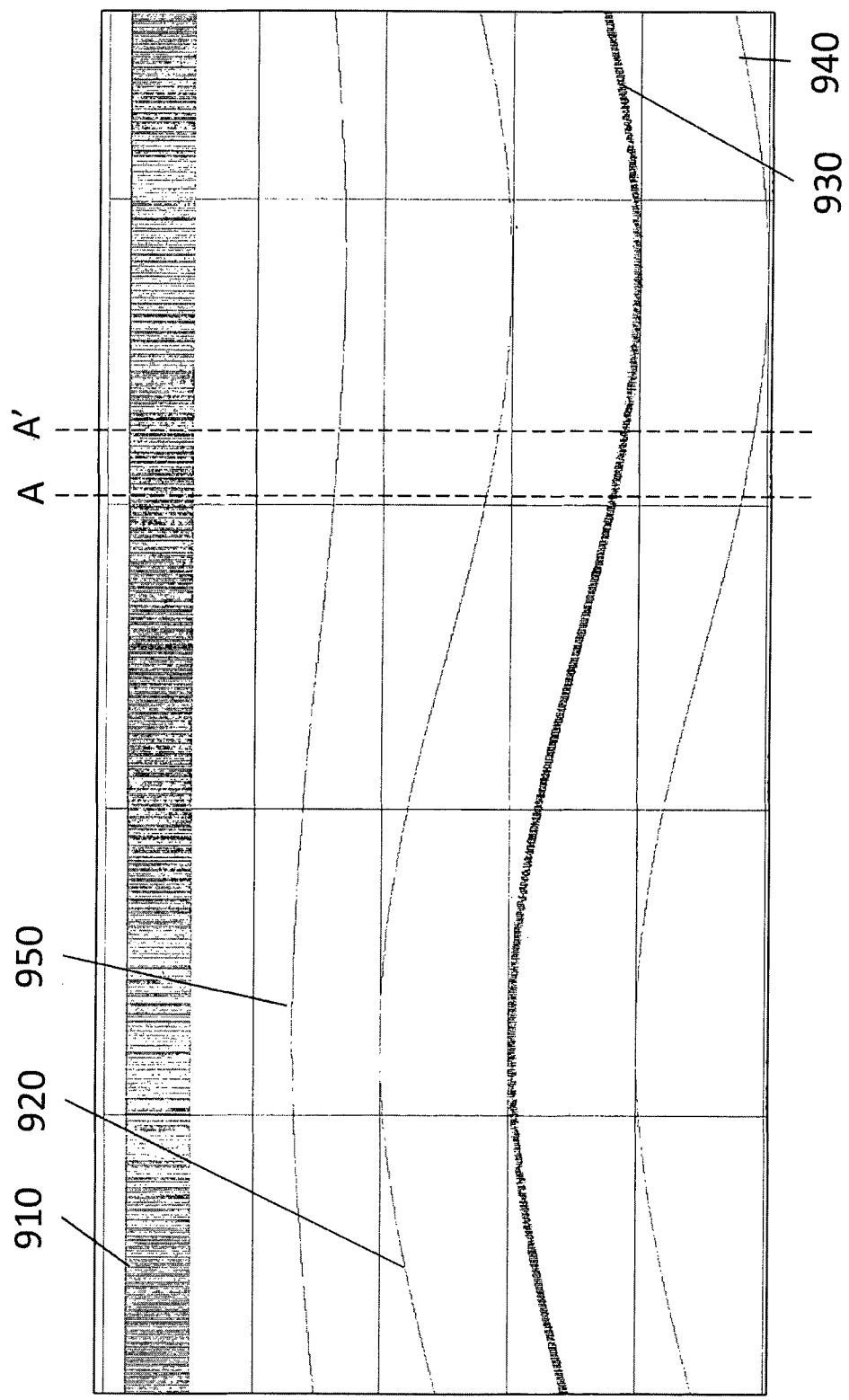
FIG. 8 illustrates the voltage waveforms at a number of points in FIG. 7.
Figure 9:
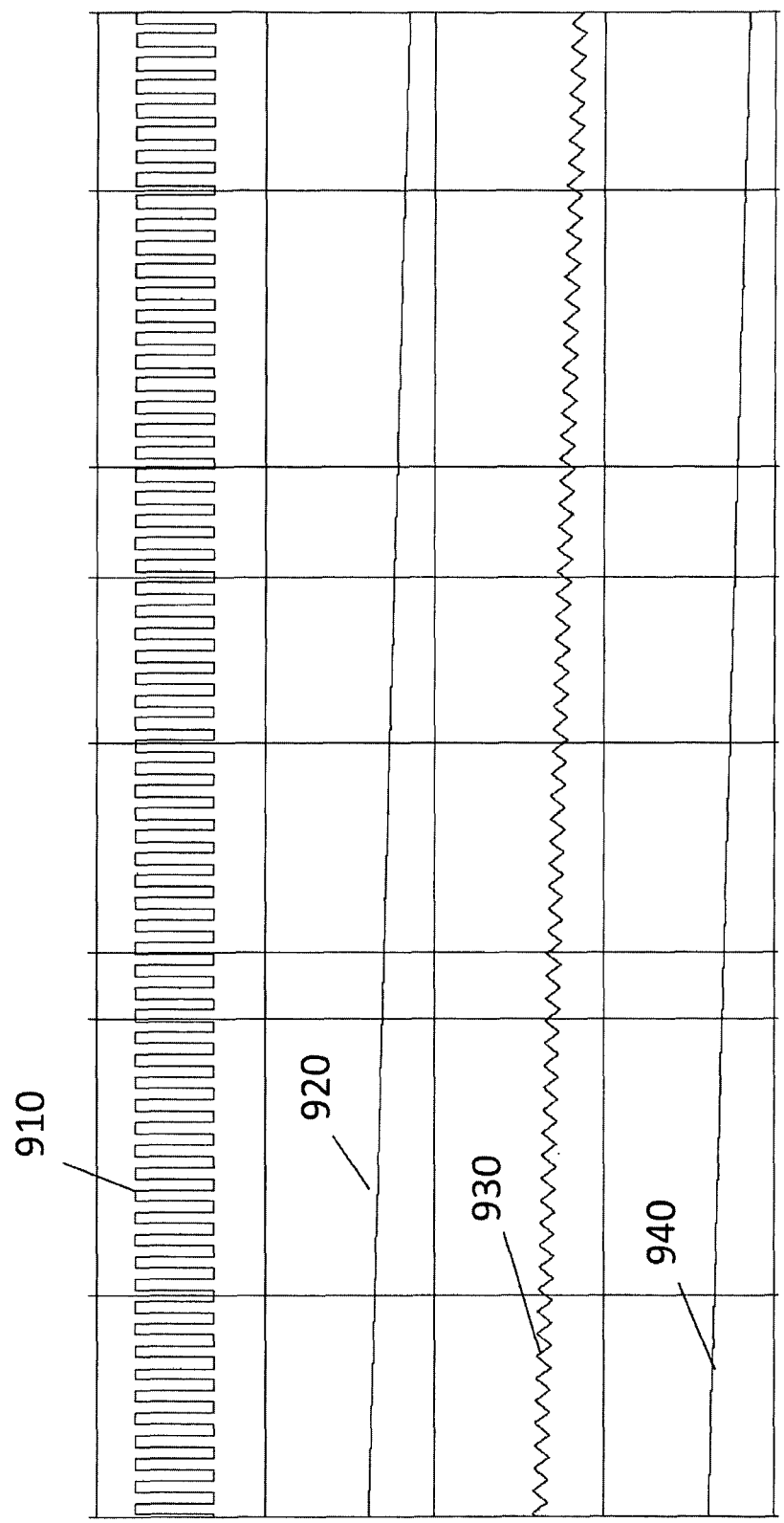
FIG. 9 is a zoomed in view of the waveforms in the portion A-A' of FIG. 8.

The circuit 16 of FIG. 7 illustrates a fourth embodiment of the invention. This embodiment can be used for audio applications where the frequency and amplitude range and control requirements are extreme, and therefore demonstrates one of the most difficult applications. This embodiment involves a half-bridge switching circuit and is advantageous over full-bridge circuits described below because it may provide a lower cost alternative in some applications. FIGS. 7, 8 and 9 relate to this embodiment.

The circuit 16 comprises a power supply unit 2, a comparator 4, a lossy integrator 6, a half-bridge circuit 7, a low-pass filter network 11 and a load 12. The circuit 16 differs from the circuit 1 in that it has a bias generator 17 that includes functionality which is not present in the bias generator 3 of circuit 1. The bias generator 17 now incorporates a signal V5 shifted by the Bias voltage.

As can be seen from the signal traces of FIGS. 8 and 9 the circuit 16 operates as a signal amplifier. FIG. 8 illustrates a full cycle while FIG. 9 illustrates a zoomed in section labelled A-A' of FIG. 8. Referring to the waveforms in FIG. 8, the voltage across the load $V_{R2}$ 950 is proportional to the signal V5 920. S2 930 can now be seen to also follow the signal 920. The zoomed-in traces of FIG. 9 show that when the signal is at a minimum, i.e. simply the normal bias voltage, the switching looks very similar to the example of FIG. 2, and the frequency is at a maximum. Consequently, when the signal is at a maximum the switching frequency reduces in response.

Figure 10:
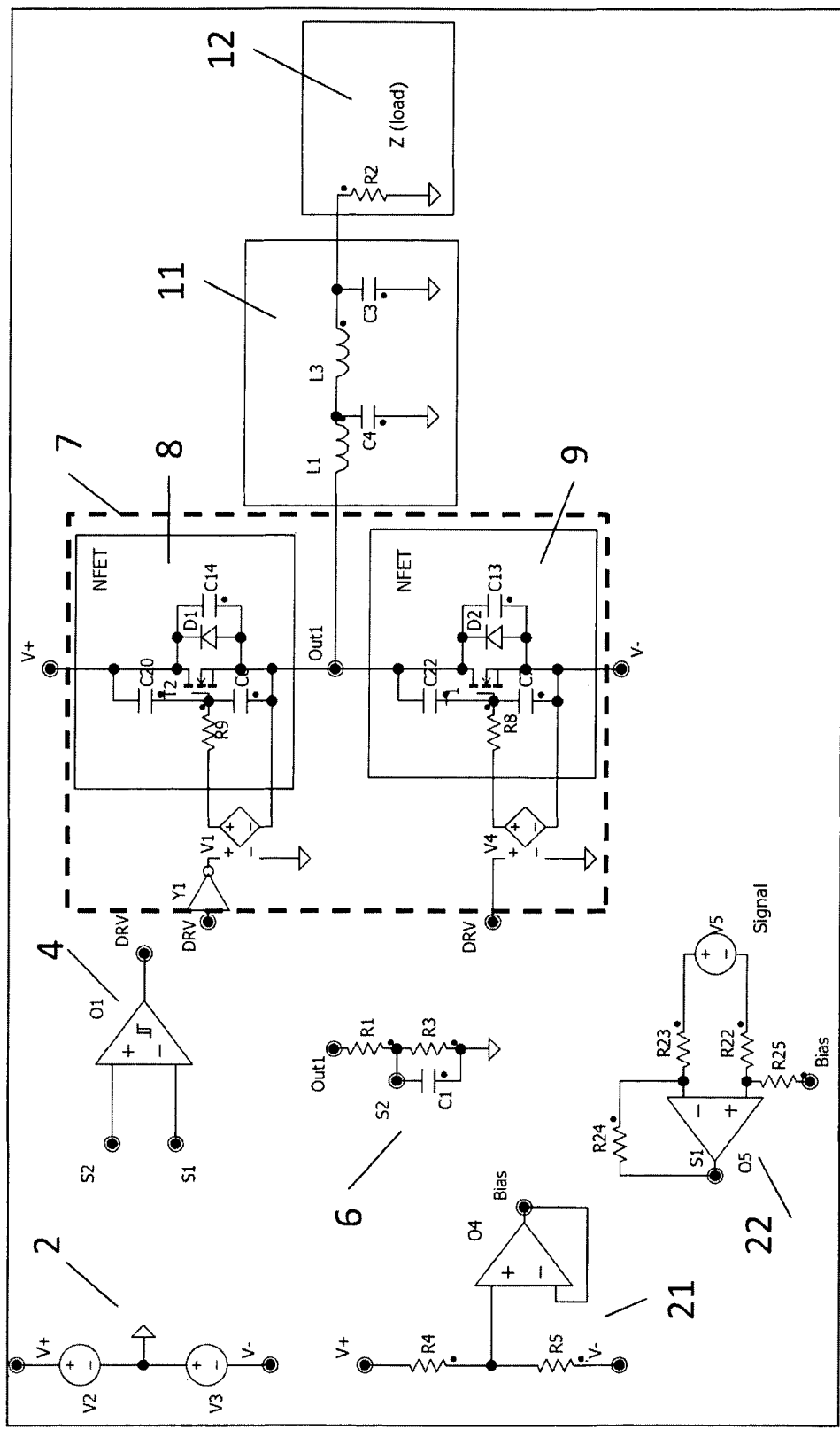
FIG. 10 is a schematic of a circuit according to a fifth embodiment of the present invention.
Figure 10A:
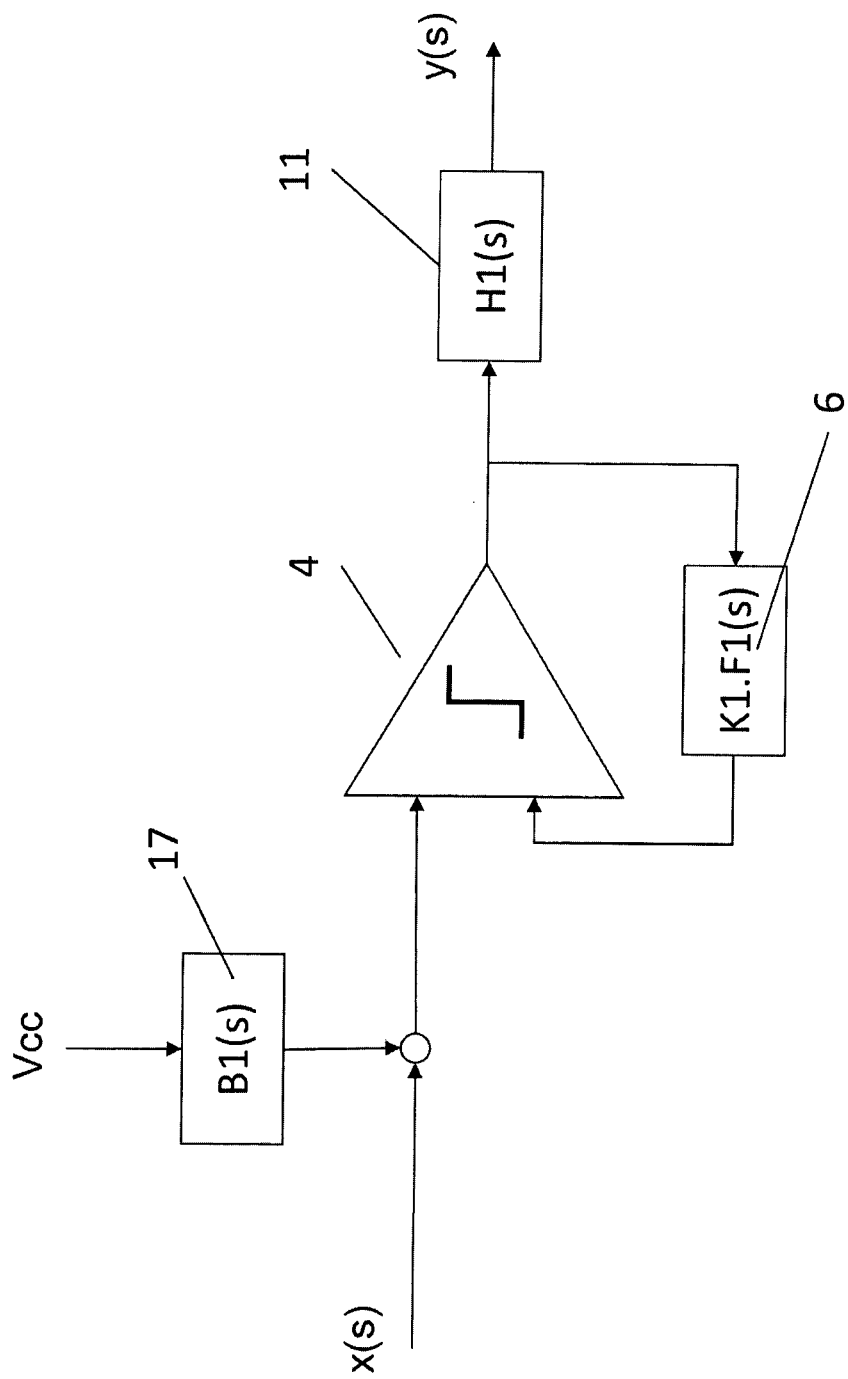
FIG. 10A is a mathematical model of the embodiment shown in FIG. 10.

The circuit 19 of FIG. 10 illustrates a fifth embodiment of the invention. FIG. 10A is a simplified mathematical model corresponding to the circuit depicted in FIG. 10. The circuit 19 comprises a power supply unit 2, a comparator 4, a lossy integrator 6, a half-bridge circuit 7, a low-pass filter network 11 and a load 12. The circuit 19 differs from the circuits 1 and 16 in the construction of the bias generator 21 and the addition of a signal and bias summing circuit 22. The bias generator 21 now incorporates a voltage following buffer O4 to provide an accurate voltage source representing the bias voltage, which also ensures that minimal signal is allowed to flow back into the bias source. This is then used to bias a differential amplifier in the signal and bias summing circuit 22 which mixes in the differential signal in V5. The result is a system which will reject voltage supply variation. This circuit provides power supply rejection and improves the practical noise performance of the combined amplifier and power supply performance.

Figure 11:
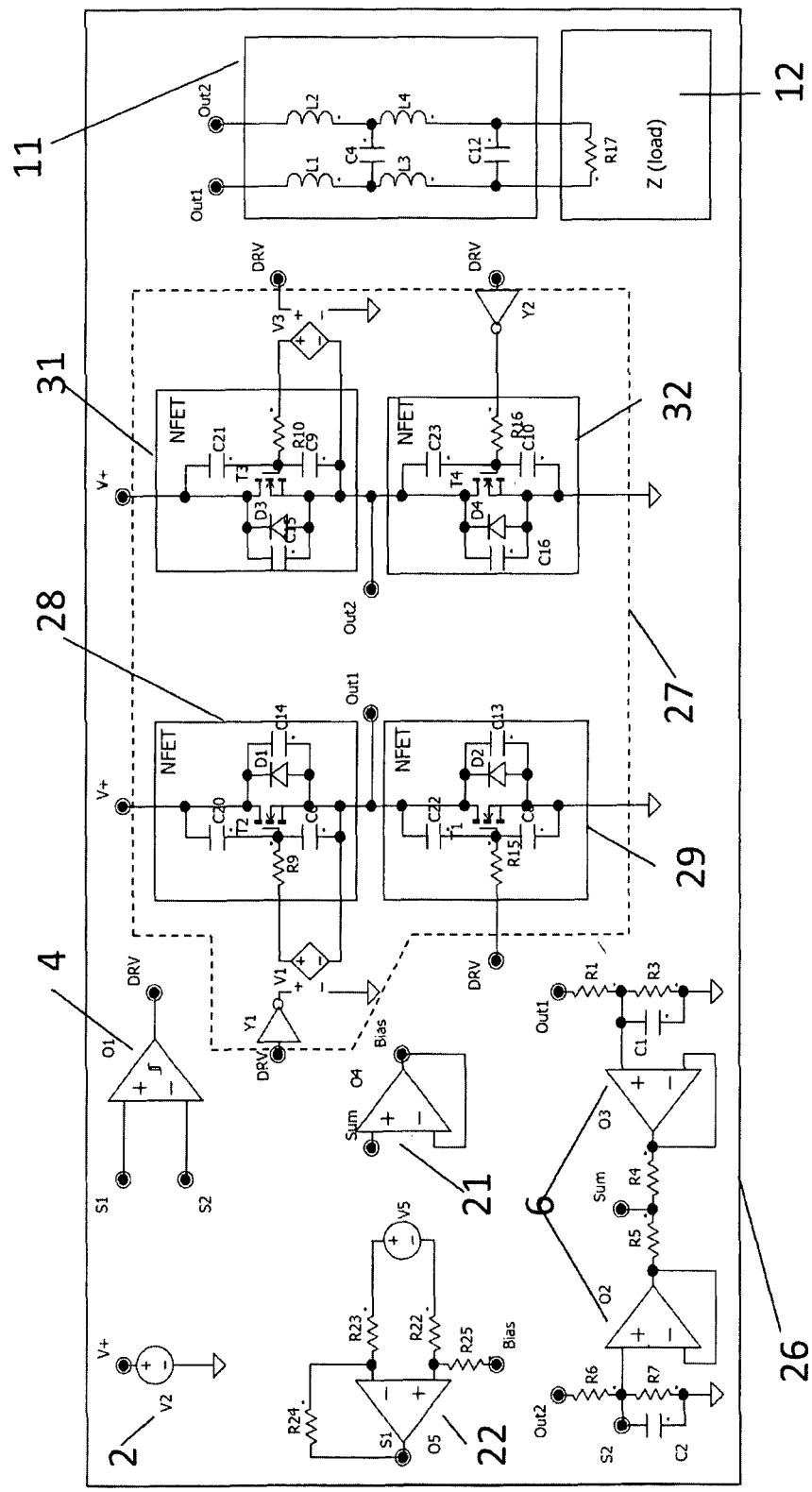
FIG. 11 is a schematic of a circuit according to a sixth embodiment of the present invention.

The circuit 26 of FIG. 11 illustrates a sixth embodiment of the invention. The circuit 26 comprises a power supply unit 2, a comparator 4, two lossy integrators 6, a "full-bridge" or "H-bridge" circuit 27, a low-pass filter network 11 and a load 12. The circuit 26, as with the circuit 19, differs from the circuits 1 and 16 in that it includes a bias generator 21 and a signal and bias summing circuit 22.

The H-bridge circuit 27 comprises a first, second, third and fourth NFET circuit 28, 29, 31 and 32 respectively. The NFET circuits 28 and 29 constitute one half-bridge circuit and the NFET circuits 31 and 31 constitute another half-bridge circuit. The low-pass filter 11 is now connected between the two half-bridge circuits and is terminated by the load 12.

As with the half-bridge circuits of FIGS. 1, 7 and 10, a lossy integrator 6 connects to each bridge midpoint Out1. This is then buffered as before, with the bias now being generated by summing the two half bridge signals. If there is no error in the system, both signals will be identical but opposite about the bias. If the sides are not opposite, then the bias will move, representing error. This is then summed with the desired signal by the signal and bias summing circuit 22 and presented to the comparator 4. The comparator 4 compares the signal with the output of one of the lossy integrators 6. The comparator 4 will then switch to keep the two signals as close to each other as possible, as with the half bridge embodiment depicted in FIG. 7.

By collecting and summing both halves of the bridge, the error across the output filter 11 is known with great accuracy. Any power rail fluctuation will appear on both halves equally, and will therefore move the bias point accordingly. This is then compensated by the comparator 4, ensuring that the voltage rail noise is rejected and not present on the output filter 11.

Any signal mixed with the bias can be considered to be further error, but as that signal should exist on both halves of the H-bridge 27 equally and in opposite polarity, it does not appear at the bias voltage. Therefore in compensating, the comparator actually adds the signal on both halves equally. Any imbalance as stated above, does appear in the bias signal, and is therefore rejected.

Figure 12:
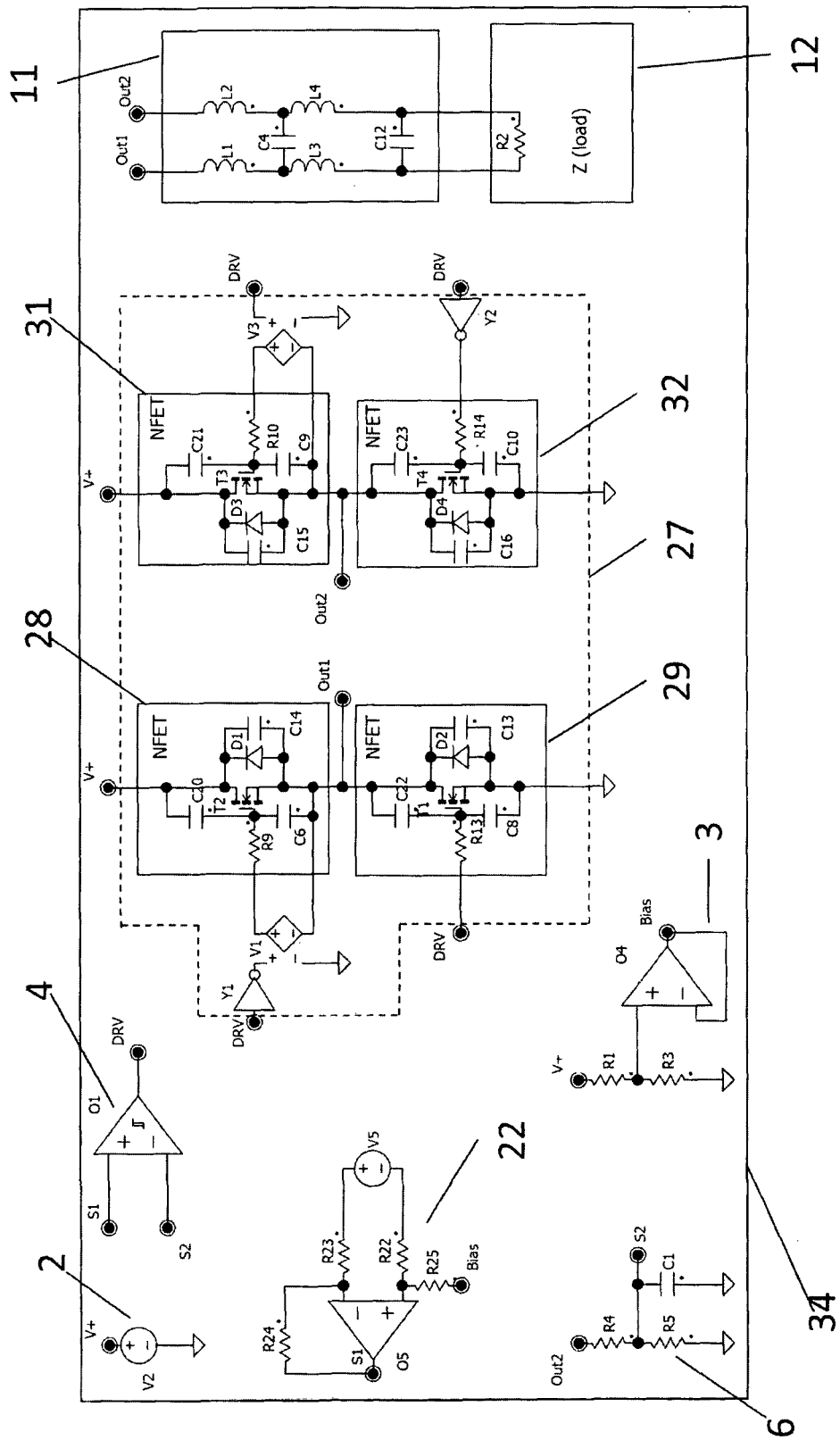
FIG. 12 is a schematic of a circuit according to a seventh embodiment of the present invention.

The circuit 34 of FIG. 12 illustrates a sixth embodiment of the present invention. The circuit 34 comprises a power supply unit 2, a bias generator 3, a comparator 4, a single lossy integrator 6, a full-bridge or H-bridge circuit 27, a low-pass filter network 11 and a load 12. The circuit 34 of FIG. 12 has a reduced component count when compared with the circuit 26 of FIG. 11, at the cost of reduced error detection.

Figure 13:
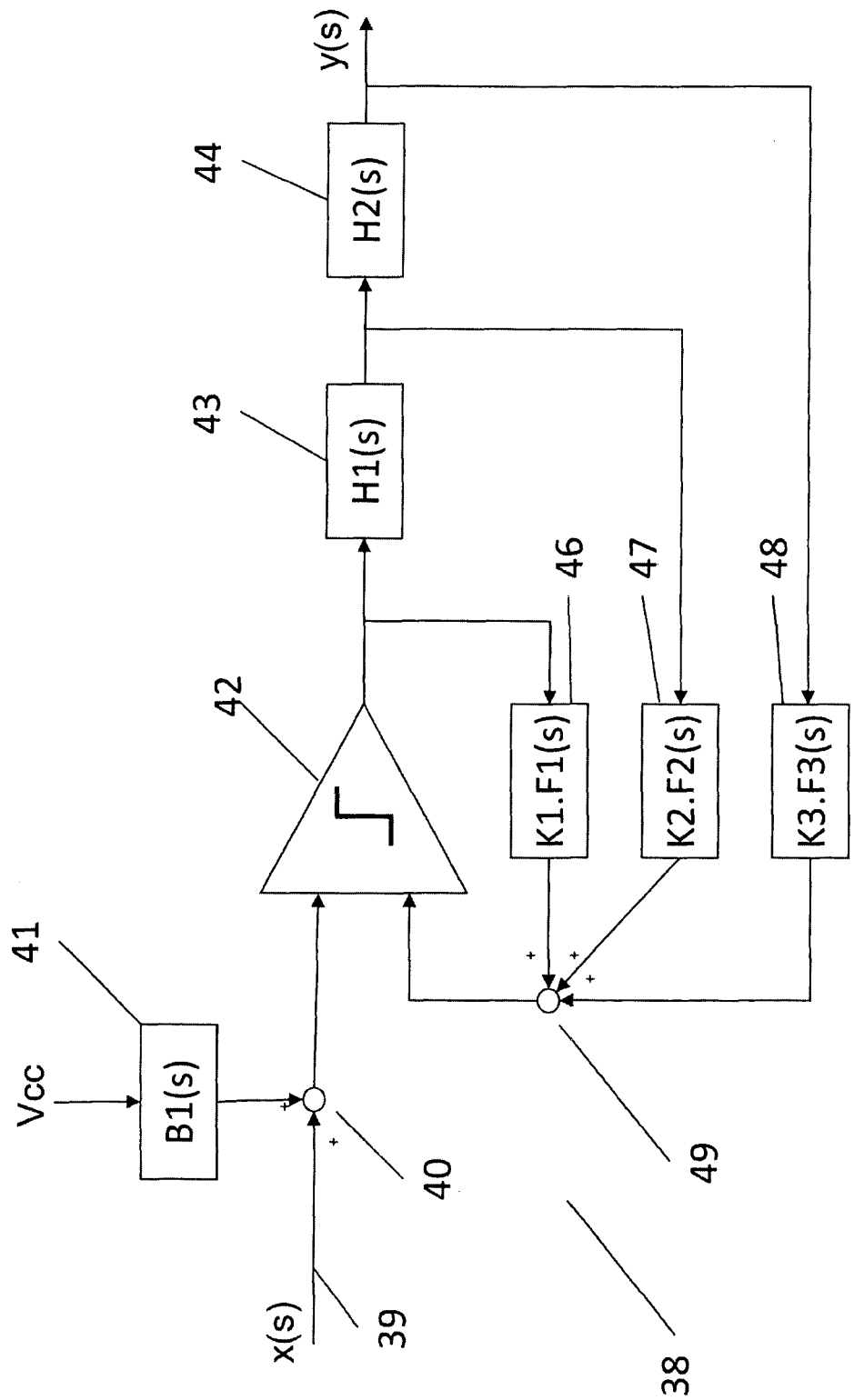
FIG. 13 is a highly generalized functional diagram for a mathematical model of another embodiment of the invention.

FIG. 13 shows a mathematical model 38 for another embodiment of the invention. The model 38 includes an input signal X(s) identified by reference number 39 as being summed with a bias voltage 41 at 40. The bias voltage 41 is generated in any suitable manner and preferable is generated in accordance with previously-described embodiments of the present invention. The resultant of that summation is one input to the comparator 42.

The other input to the comparator 42 is the summation 49 of a number of signals. One of those signals is the output of the comparator 42 transformed by the function K1·F1(s) 46, where K1 is a scaling ratio for gain and F1(s) is the lossy integrator. This creates the automatic oscillation. The functions H1(s) 41 and H2(s) 44 are various optional output filters. The second of the inputs to the summation 49 is the output of the comparator 42 transformed by the function H1(s)·K2·F2(s). The transformation K2·F2(s) 47 is an optional additional feedback function. This embodiment allows any number of feedback paths (Kn·Fn(s)), which are exemplified in FIG. 13 only by the path H2(s)·K3·F3(s).

Figure 14:
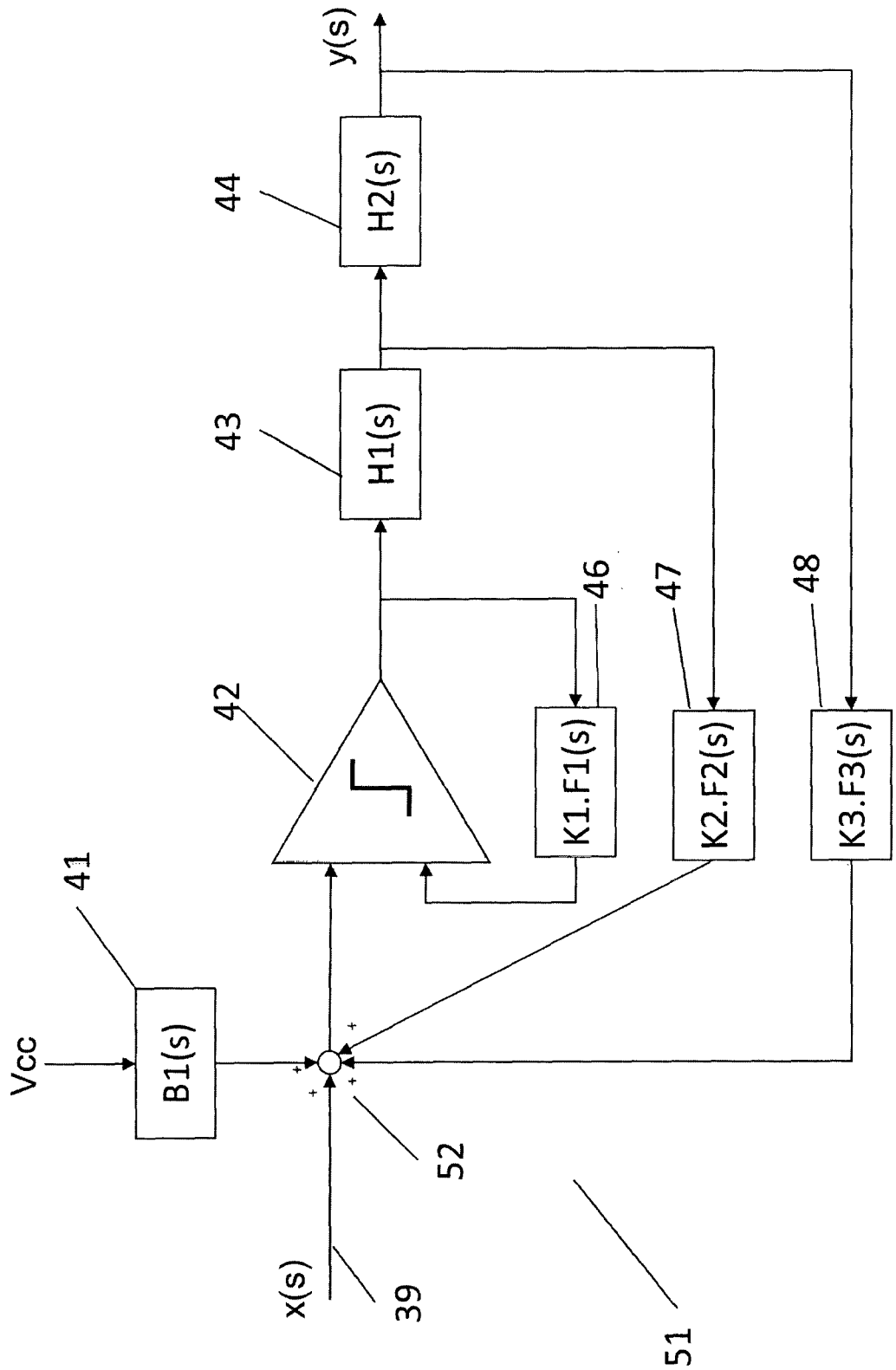
FIG. 14 is a highly generalized functional diagram for a mathematical model of yet another embodiment of the invention.

The model 51 of FIG. 14 differs from the model 38 of FIG. 13 only in respect of how the summation takes place. As with the model 38 of FIG. 13, one of the inputs to the comparator 42 is the output of that comparator, scaled by the function K1·F1(s). However, no other signals are summed at that point. Instead, the output of the comparator, further transformed by the transformations H1(s)·K2·F2(s) and H2·K3·F3(S) are summed together with the bias and with the signal 39 at the summation 52.

Figure 15:
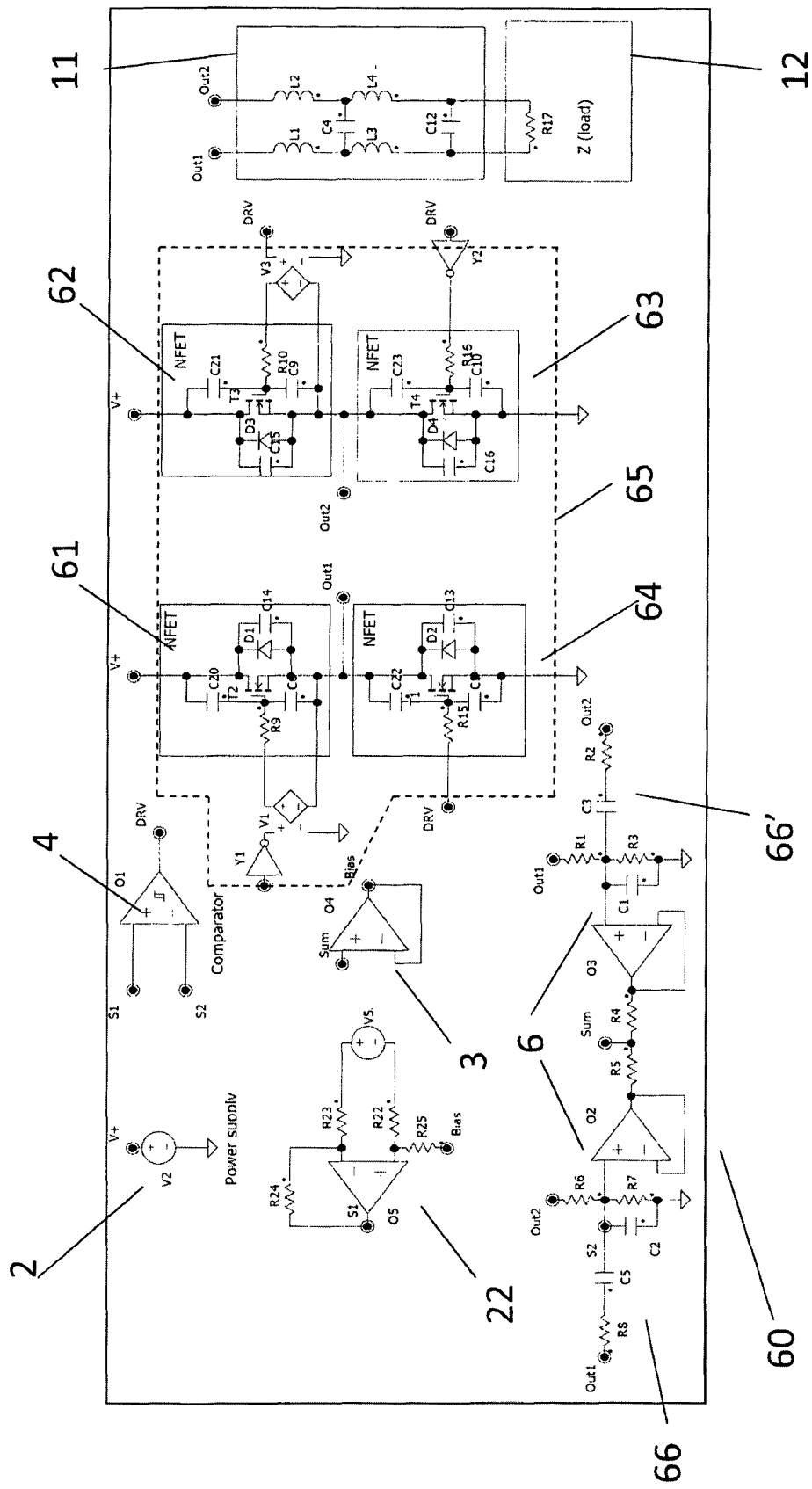
FIG. 15 is a schematic of a circuit according to another embodiment of the present invention.

FIG. 15 is a schematic of a circuit 60 illustrating a further embodiment of the present invention. The circuit 60 comprises a power supply unit 2, a bias generator 3, a comparator 4, two lossy integrators 6, a full bridge or H-bridge switching circuit 65, a low-pass filter network 11 and a load 12. In this embodiment Out1 is now connected via a derivative connection 66, comprising resistor R8 and capacitor C5, to Out2 of the lossy integrator 6, and Out2 is now connected via another derivative connection 66', comprising resistor R2 and capacitor C3, to Out1 of the other lossy integrator 6. The cross over provides the compensation (i.e. negation), while the resistance and capacitance values, of R8, R2 and C5, C3 respectively, in conjunction with the lossy integrators 6 determine the system frequency response. This enables a reduction in the total harmonic distortion (THD) of the system, cancelling part of the decaying waveform nature of a lossy integrator.

Figure 15A:
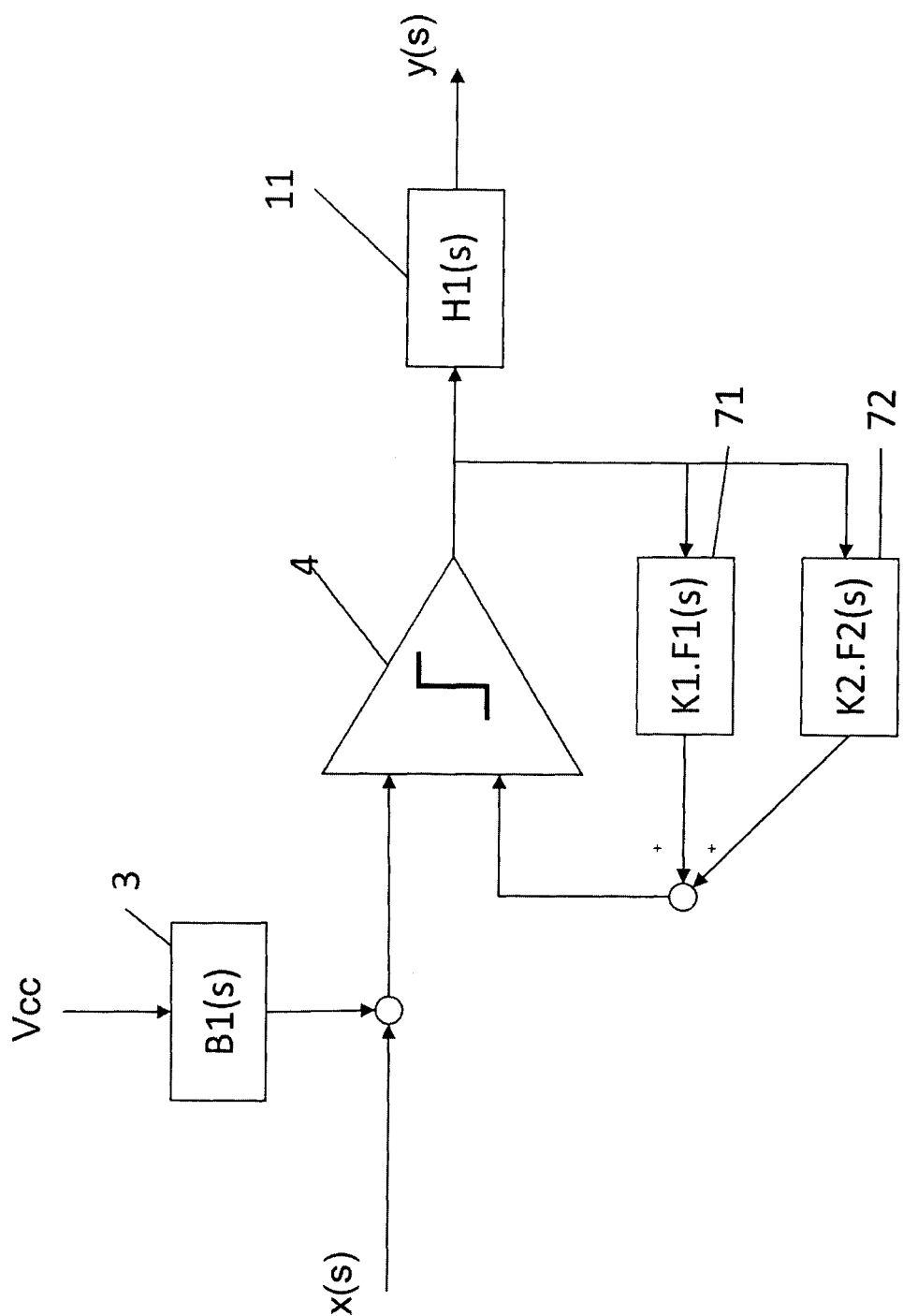
FIG. 15A is a mathematical model of the embodiment shown in FIG. 15.

FIG. 15A illustrates a mathematical model of FIG. 15 wherein two independent transfer functions K1·F1(s), K1·F2(s) 71, 72 receive input from the square wave output from the comparator 4. K1·F1(s) may be the lossy integrator responsible for the carrier generation and K2·F2(s) is a negative derivative. Summing these features neutralizes the THD effect of the lossy integrator because the carrier now contains more high frequency information which shifts the carrier gradients in the opposite direction to the parasitic THD of the lossy integrator 6.

Figure 16:
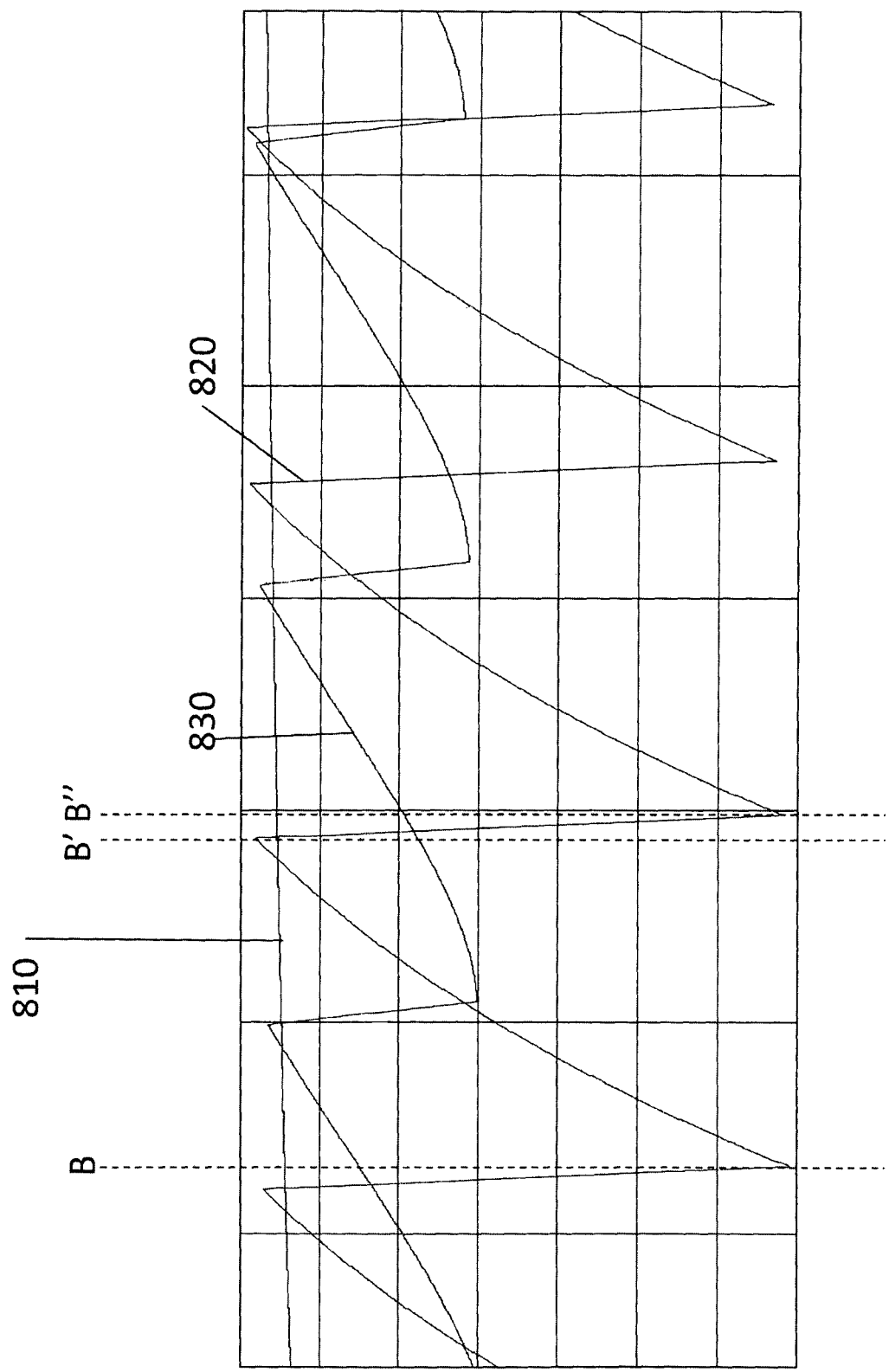
FIG. 16 illustrates the voltage waveforms of an input signal, a carrier signal according to a circuit of a previous embodiment, and a carrier signal according to the embodiment depicted in FIG. 15.

FIG. 16 shows an input signal 810 that is to be tracked and amplified. Waveforms 820 and 830 are carrier signals and waveform 820 is an original, non-compensated integrated signal from a prior art circuit and 830 is the waveform that results using the circuit of FIG. 15 or model of FIG. 15A which has a derivative connection.

The signal gain of a "lossy integrator" is not constant over the signal voltage range, tending to reduce as the input signal increases in magnitude.

In FIG. 16, the waveforms 820 and 830 will change shape depending on the input signal 810.

The non-compensated integrated signal 820 has a long 'charge' period B-B' and a short 'discharge' period B'-B". This is a by-product of the digital time delay of the comparator, and the difference voltage gradients when the carrier is not about the mid-rail (where the carrier is symmetric). The result is an excessive over shoot tending towards the mid rail, an effect which becomes more pronounced as the signal moves further from mid rail and hence compression.

Waveform 830 is the result of using the circuit in FIG. 15, that is, adding an approximate or ideal negative derivative. Note that the input signal is identical for the two carriers. However, the carrier waveform 830 differs from waveform 820 in a number of ways. The most obvious is the significantly smaller overshoot, which reduces the THD immediately. Another and more subtle difference is the change in the 'charging' (or rising) edge of the waveforms. In waveform 830 the decay initially is in fact reversed, causing acceleration away from mid rail. This acceleration is short, and begins to decay again. This is why the overshoot is reduced.

In addition, the carrier frequency is reduced, which has the advantage of reducing system noise, whilst also reducing switching power. The Hypex patent attempts to produce a similar effect but through much more complex means.

The invention differs from prior art circuits in many aspects. The circuit samples the output voltage of the switch unit, not the post filter output, and it is the switched stage that produces a triangle wave carrier via a lossy integrator. The inventor's assumption is that a correctly designed passive filter will add little distortion but attempts to use post filter network signals excessively may add intermodulation distortion due to the filter delay. While it is an option to add post filter feedback, it is desired to minimise this for the reasons already stated.

The lossy integrator creates a self-oscillating circuit where the frequency of operation is dependent on the propagation delay of the circuit which is deliberately modified to suit the circuit task. Thus the filter design and operation is almost an independent function. The circuit frequency is not "fixedly" determined. This independent operation of the filter is required so that EMI issues can be addressed in many applications.

The circuit smears any intermodulation products to inaudible levels over a wide frequency range. Normally intermodulation products are caused by phase and frequency non-linearities that create sum and difference products between the fixed clock and modulation signal. Mathematically, the solution for intermodulation products between a variable carrier and a signal is not easily determined, but it can be envisaged that the level at any particular frequency has much less probability of staying in one spot (and thus audible) than a fixed frequency circuit.

It is acknowledged that a lossy integrator is somewhat non ideal, but the circuit function is simple and the non-linearity of the lossy integrator can be modified by adding a distorting function derived by a simple RC network. This network adds to the waveform at the compressed peaks and troughs and adds very little at the unaffected middle of the waveform. This, to the inventor's knowledge is not reported in any known literature. This modification results in an amplifier that produces harmonic distortion that is orders of magnitude below most loudspeakers, and state of the art intermodulation distortion which is audible and annoying.

The circuits described in the above embodiments use analogue components. These circuits therefore operate in the continuous-time domain. However, the circuits can also operate in the discrete-time domain if the analogue components are substituted with digital components.

In software, the lossy integrator may be written in infinite impulse response (IIR) or finite impulse response (FIR) forms as appropriate. A digital lossy integrator has either a fixed or non-fixed amount subtracted from it on every computational cycle or set of cycles, for example.

The present invention provides a new way to control the amplifier that mitigates or even removes many of the traditional issues inherent in class-D amplifier control approaches.

A significant difference of the present invention compared with the prior art is using an integrator combined with a single comparator. This results in a much simpler, yet superior system.

Furthermore, the present invention greatly reduces the impact rail imbalances can have on the resulting signal.

Another advantage of the present invention is realised when applied to brushless motors. The system's superior switching speed and transient response allow for enhanced, yet simple drive control.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

A reference to any prior art in this specification is not, and should not be taken as, an acknowledgment or any form of suggestion that the referenced prior art forms part of the common general knowledge, whether in Australia or elsewhere.

Throughout this specification, the words "comprise", "comprised", "comprising" and "comprises" are to be taken to specify the presence of stated features, integers, steps or components but does not preclude the presence or addition of one or more other features, integers, steps, components or groups thereof.

In the claims, each dependent claim is to be read as being within the scope of its parent claim or claims, in the sense that a dependent claim is not to be interpreted as infringed unless its parent claims are also infringed.

The invention claimed is:

1. A circuit for generating a series of pulses in response to a first signal, the circuit comprising:
    a lossy integrator having an integrator output and an integrator input, the integrator output provides an integrated signal that depends at least in part on a feedback signal received at the integrator input; and
    a comparator having first and second comparator inputs and a comparator output, the first comparator input receives the first signal, the second comparator input receives a second signal that depends at least in part on the integrated signal, and the comparator output provides, based on comparison between the first and second signals, the series of pulses from which the feedback signal depends at least in part on.

2. A circuit according to claim 1, in which the lossy integrator comprises:
    a resistor having first and second terminals, the first terminal at a first node comprising the integrator input; and
    a capacitor coupled to the second terminal at a second node comprising the integrator output.

3. A circuit according to claim 2, in which the resistor is a first resistor, and in which the lossy integrator further comprises a second resistor coupled to the second terminal of the first resistor and in parallel with the capacitor at the second node.

4. A circuit according to claim 1, in which at least one of the lossy integrator or the comparator is implemented by using digital operations.

5. A circuit according to claim 1, in which the series of pulses provided at the comparator output controls switching of at least one switching element.

6. A circuit according to claim 5, in which the at least one switching element is included in a half-bridge configuration.

7. A circuit according to claim 5, in which the at least one switching element is included in a full-bridge configuration.

8. A circuit according to claim 5, in which the at least one switching element switches power to a load.

9. A circuit according to claim 8, in which a low-pass filter is interposed between the at least one switching element and the load.

10. A circuit according to claim 9, in which the load also operates as a low-pass filter.

11. A circuit according to claim 1, in which the feedback signal depends at least partly on an output signal of at least one switching element.

12. A circuit according to claim 1, in which the first signal depends at least in part on a bias signal.

13. A circuit according to claim 5, in which the at least one switching element is a transistor.

14. A circuit according to claim 13, in which the transistor is a FET.

15. A regulated power supply, comprising:
a circuit for generating a series of pulses in response to a first signal, the circuit comprising:
   a lossy integrator having an integrator output and an integrator input, the integrator output provides an integrated signal that depends at least in part on a feedback signal received at the integrator input; and
   a comparator having first and second comparator inputs and a comparator output, the first comparator input receives the first signal, the second comparator input receives a second signal that depends at least in part on the integrated signal, and the comparator output provides, based on comparison between the first and second signals, the series of pulses from which the feedback signal depends at least in part on.

16. An amplifier, comprising:
a circuit for generating a series of pulses in response to a first signal, the circuit comprising:
   a lossy integrator having an integrator output and an integrator input, the integrator output provides an integrated signal that depends at least in part on a feedback signal received at the integrator input; and
   a comparator having first and second comparator inputs and a comparator output, the first comparator input receives the first signal, the second comparator input receives a second signal that depends at least in part on the integrated signal, and the comparator output provides, based on comparison between the first and second signals, the series of pulses from which the feedback signal depends at least in part on.

17. A circuit according to claim 2, in which the series of pulses controls switching of at least one switching element.

18. A circuit according to claim 3, in which the series of pulses controls switching of at least one switching element.

19. A circuit according to claim 4, in which the series of pulses controls switching of at least one switching element.

20. A circuit according to claim 1, in which the first signal depends at least in part on an input signal which is to be amplified.

21. A circuit according to claim 1, in which the feedback signal is the series of pulses.

22. A circuit according to claim 1, in which the feedback signal is a first feedback signal, the circuit further comprising a high-pass filter having a filter output and a filter input, the filter output provides a filtered signal that depends at least in part on a second feedback signal received at the filter input, the second feedback signal depends at least in part on an inverse of the first feedback signal, and the filtered signal, when summed with the integrated signal, establishes the second signal received at the second comparator input.

23. A circuit according to claim 22, in which the second feedback signal is an inverse of the series of pulses.

* * * * *